United States Patent
Lee et al.

(10) Patent No.: US 11,824,553 B2
(45) Date of Patent: Nov. 21, 2023

(54) UNITY-GAIN BUFFER CIRCUIT STRUCTURE

(71) Applicant: Advanced Analog Technology, Inc., Zhubei (TW)

(72) Inventors: Kun-Hsu Lee, Zhubei (TW); Wen Jung Su, Zhubei (TW)

(73) Assignee: ADVANCED ANALOG TECHNOLOGY, INC., Zhubei (TW)

( * ) Notice: Subject to any disclaimer, the term of this patent is extended or adjusted under 35 U.S.C. 154(b) by 0 days.

(21) Appl. No.: 17/709,369

(22) Filed: Mar. 30, 2022

(65) Prior Publication Data

US 2023/0253977 A1    Aug. 10, 2023

(30) Foreign Application Priority Data

Feb. 10, 2022   (TW) .................................. 111104956

(51) Int. Cl.
*H03M 1/18* (2006.01)
*H03M 1/08* (2006.01)

(52) U.S. Cl.
CPC ........... *H03M 1/185* (2013.01); *H03M 1/089* (2013.01)

(58) Field of Classification Search
CPC .............................. H03M 1/185; H03M 1/089
See application file for complete search history.

(56) References Cited

U.S. PATENT DOCUMENTS

| | | | |
|---|---|---|---|
| 10,063,143 B1* | 8/2018 | Fan | H02M 5/458 |
| 10,110,177 B1* | 10/2018 | Koroglu | H03F 3/21 |
| 10,644,378 B1* | 5/2020 | Lu | H03F 3/19 |
| 2003/0169048 A1* | 9/2003 | Kim | G01R 31/3835 |
| | | | 324/426 |
| 2006/0038610 A1* | 2/2006 | Gudem | H03H 11/1252 |
| | | | 327/552 |
| 2006/0261884 A1* | 11/2006 | Gammie | H03F 3/45973 |
| | | | 330/9 |
| 2006/0267686 A1* | 11/2006 | Luo | H03F 3/45659 |
| | | | 330/258 |
| 2013/0108261 A1* | 5/2013 | Jiang | H04B 10/69 |
| | | | 398/38 |
| 2017/0359532 A1* | 12/2017 | Yuan | H04N 25/60 |

* cited by examiner

*Primary Examiner* — Lam T Mai

(74) *Attorney, Agent, or Firm* — MUNCY, GEISSLER, OLDS & LOWE, P.C.

(57) ABSTRACT

A unity-gain buffer circuit structure, used to receive an input voltage and output an output voltage, includes a first operational amplifier and a second operational amplifier. The first operational amplifier includes a first positive input, a first output and a first negative input. The second operational amplifier, coupled electrically with the first operational amplifier, includes a second positive input, a second output and a second negative input. The second positive input is used to receive the output voltage. The second output, coupled with first negative input, is used to output a second output voltage. The second negative input, coupled with the second output, is used to receive the second output voltage. After the first negative input receives the second output voltage, an offset voltage between the output voltage outputted from the first operational amplifier and the input voltage received by the first operational amplifier is close to 0.

6 Claims, 5 Drawing Sheets

UNITY-GAIN BUFFER CIRCUIT STRUCTURE

This application claims the benefit of Taiwan Patent Application Serial No. 111104956, filed Feb. 10, 2022, the subject matter of which is incorporated herein by reference.

BACKGROUND OF THE INVENTION

(1) Field of the Invention

The invention relates to a circuit structure, and more particularly to a unity-gain buffer circuit structure.

(2) Description of the Prior Art

The unity-gain buffer, also called as a voltage follower, is widely applied in various circuits such as digital-to-analog converters. Practically, the operational amplifier is usually used as the unity-gain buffer.

Referring to FIG. 1, a conventional unity-gain buffer is schematically illustrated. As shown, a unity-gain buffer PA1 includes a positive input end IP, a negative input end IN and an output end OUT. The positive input end IP is used to receive an input voltage V1. The output end OUT is used to output an output voltage V2. The negative input end IN is used to receive an output voltage V2 fed back from the output end OUT. In the art, the unity-gain buffer PA1 is used to provide a gain amplified value. Since the unity-gain buffer PA1 is unable to amplify signals, and thus the output voltage V2 is equal to the input voltage V1, thus the expected gain amplified value is 1.

In addition, the unity-gain buffer PA1 further includes a switch end PDN, a power source end Vp and a bias current end IB. Upon receiving a switching voltage EN, the switch end PDN would start the unity-gain buffer PA1. The power source end Vp is used to receive a DC source VDD. The bias current end IB is used to receive a bias current I1. The switch end PDN, the power source end Vp and the bias current end IB are all well known in the art, and thus details thereabout would be omitted herein.

Nevertheless, due to the circuit structuring and the manufacturing processes, a difference between the output voltage V2 and the input voltage V1 exists; i.e., an offset voltage. Thus, this conventional design needs to be improved.

SUMMARY OF THE INVENTION

In view that the conventional unity-gain buffer would generate an offset voltage between the input voltage and the output voltage, and this offset voltage may cause some problems, accordingly, it is an object of the present invention to provide a unity-gain buffer circuit structure for resolving at least one of the problems in the art.

In this invention, a unity-gain buffer circuit structure, used to receive an input voltage and output an output voltage, includes a first operational amplifier and a second operational amplifier. The first operational amplifier includes a first positive input, a first output and a first negative input. The second operational amplifier, coupled electrically with the first operational amplifier, includes a second positive input, a second output and a second negative input. The second positive input is used to receive the output voltage. The second output, coupled with first negative input, is used to output a second output voltage. The second negative input, coupled with the second output, is used to receive the second output voltage. After the first negative input receives the second output voltage, an offset voltage between the output voltage outputted from the first operational amplifier and the input voltage received by the first operational amplifier is close to 0.

In one embodiment of the present invention, the first operational amplifier further includes a first switch end, and the first operational amplifier is activated upon when the first switch end receives a first starting voltage.

In one embodiment of the present invention, the second operational amplifier further includes a second switch end, and the second operational amplifier is activated upon when the second switch end receives a second starting voltage.

In one embodiment of the present invention, the first operational amplifier further includes a first power source end for receiving a first DC source.

In one embodiment of the present invention, the second operational amplifier further includes a second power source end for receiving a second DC source identical to the first DC source.

In one embodiment of the present invention, the first operational amplifier further includes a first bias current end for receiving a first bias current.

In one embodiment of the present invention, the second operational amplifier further includes a second bias current end for receiving a second bias current identical to the first bias current.

As stated above, in the unity-gain buffer circuit structure provided by this invention, the first operational amplifier and the second operational amplifier are coupled together to reduce the offset voltage. In comparison with the conventional design, both the theoretical derivation and the simulation data have proven that this invention can effectively reduce the offset voltage.

All these objects are achieved by the unity-gain buffer circuit structure described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a unity-gain buffer circuit structure. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
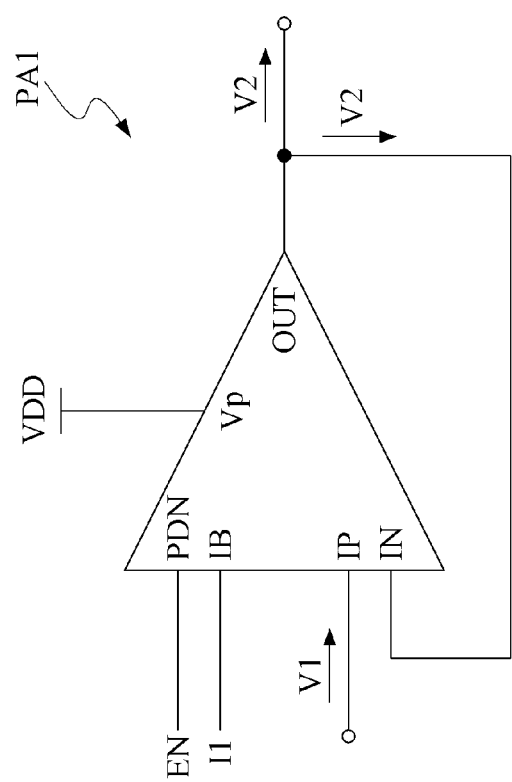
FIG. 1 is a schematic view of a conventional unity-gain buffer.
Figure 2:
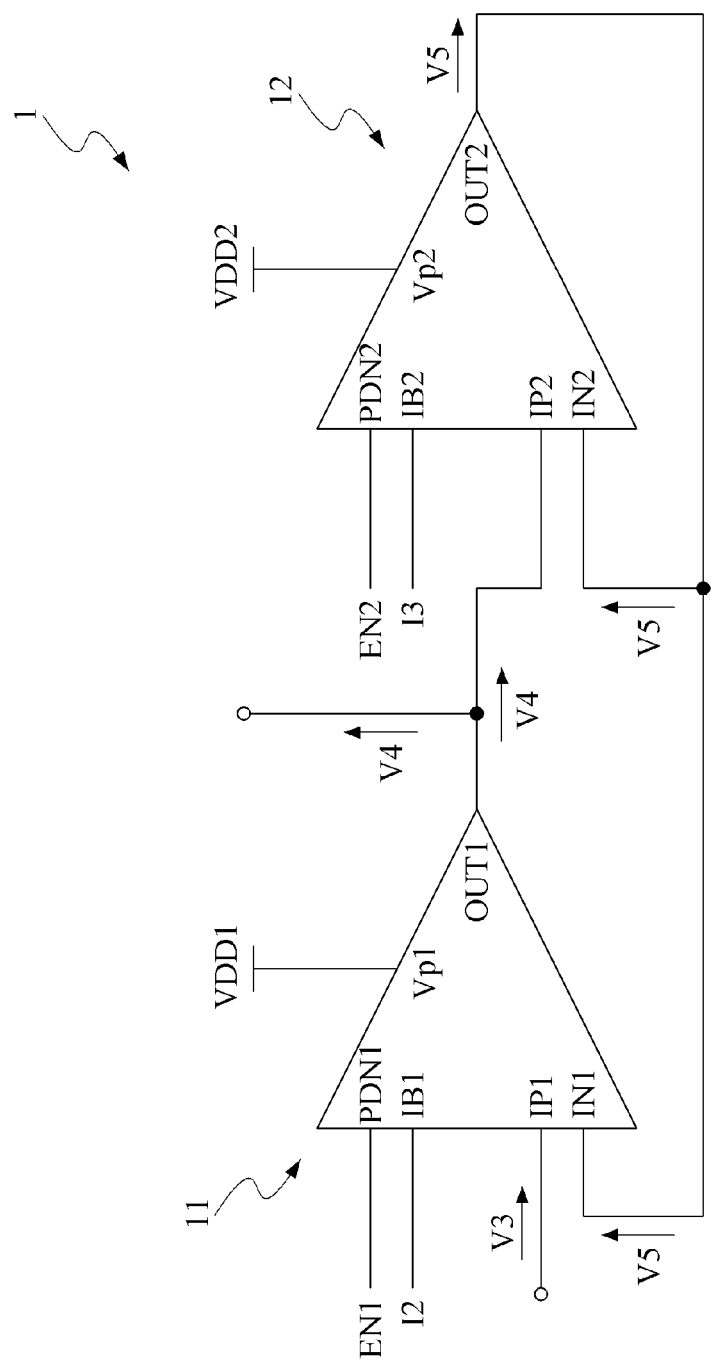
FIG. 2 is a schematic view of a preferred embodiment of the unity-gain buffer circuit structure in accordance with the present invention.

Referring to FIG. 2, a preferred embodiment of the unity-gain buffer circuit structure in accordance with the present invention is schematically shown. In this embodiment, the unity-gain buffer circuit structure 1, used to receive an input voltage V3 and output an output voltage V4, includes a first operational amplifier 11 and a second operational amplifier 12. It shall be explained that the unity-gain buffer circuit structure 1 can be a structure, such as the structure shown in FIG. 2, which the first operational amplifier 11 and the second operational amplifier 12 are electrically coupled together to form the circuit structure; or a device, formed as a unity-gain buffer having the first operational amplifier 11 and the second operational amplifier 12 coupled together.

The first operational amplifier 11 includes a first positive input IP1, a first output OUT1 and a first negative input IN1.

The first positive input IP1 is used to receive the input voltage V3. The first output OUT1 is used to output the output voltage V4.

The second operational amplifier 12, coupled electrically with the first operational amplifier 11, includes a second positive input IP2, a second output OUT2 and a second negative input IN2.

The second positive input IP2, coupled electrically with the first output OUT1 of the first operational amplifier 11, is used to receive the output voltage V4. The second output OUT2, coupled with the first negative input IN1 and the second negative input IN2, is used to output a second output voltage V5. The second negative input IN2 is used to receive the second output voltage V5.

After the first negative input IN1 receives the second output voltage V5 outputted from the second output OUT2 of the second operational amplifier 12, the output voltage V4 outputted from the first operational amplifier 11 would be affected, and an offset voltage between the output voltage V4 and the input voltage V3 would be further close to 0, in comparison to the prior art. In addition, since the second output OUT2 of the second operational amplifier 12 is coupled with the second negative input IN2, thus the second operational amplifier 12 itself is a unity-gain buffer circuit structure.

In this embodiment, the first operational amplifier 11 further includes a first switch end PDN1, a first power source end Vp1 and a first bias current end IB1. When the first switch end PDN1 is used to receive a first starting voltage EN1, the first operational amplifier 11 would be started. The first power source end Vp1 is used to receive a first DC source VDD1, and the first bias current end IB1 is used to receive a first bias current I2.

In this embodiment, the second operational amplifier 12 further includes a second switch end PDN2, a second power source end Vp2 and a second bias current end IB2. When the second switch end PDN2 is used to receive a second starting voltage EN2, the second operational amplifier 12 would be started. The second power source end Vp2 is used to receive a second DC source VDD2, the same as the first DC source VDD1. The second bias current end IB2 is used to receive a second bias current I3, the same as the first bias current I2.

The first switch end PDN1, the first power source end Vp1, the first bias current end IB1, the second switch end PDN2, the second power source end Vp2 and the second bias current end IB2 are all well-known in the art, and thus details thereabout would be omitted herein.

In this disclosure, both the theoretical analysis and the algebraic operation are provided. In the following description, i stands for the voltage value of the input voltage V3, x stands for the voltage value of the output voltage V4, y stands for the voltage value of the second output voltage V5, z stands for the gain amplified value of the first operational amplifier 11, k stands for the gain amplified value of the second operational amplifier 12, w stands for the offset voltage of the first operational amplifier 11, and m stands for the offset voltage of the second operational amplifier 12. Major calculations are listed as follows.

$$x = (i - y + w)z$$

$$y = (x - y + m)k$$

$$x = zi - zy + zw$$

$$(k + 1)y = (x + m)k$$

$$y = \frac{(x + m)}{(k + 1)}k$$

$$x = zi - zy + zw$$

$$x = zi - \frac{zk}{k+1}x - \frac{zk}{k+1}m + zw$$

$$\left(1 + \frac{zk}{k+1}\right)x = zi - \frac{zk}{k+1}m + zw$$

$$x = \frac{zk+z}{zk+k+1}i + \frac{zk+z}{zk+k+1}w - \frac{zk}{zk+k+1}m$$

$$x = \frac{zk+z}{zk+k+1}i + \frac{zk+z}{zk+k+1}(w - m) + \frac{z}{zk+k+1}m$$

When each of the gain amplified value (z) of the first operational amplifier 11 and the gain amplified value (k) of the second operational amplifier 12 is far larger than 1, the x=i+(w−m) can be further derived.

Since the first operational amplifier 11 and the second operational amplifier 12 are both the same operational amplifiers, thus the offset voltage (w) of the first operational amplifier 11 can be treated to be equal to the offset voltage (m) of the second operational amplifier 12. Thus, the x=i can be derived. Namely, according to the aforesaid theoretical derivation, the voltage value (i) of the input voltage V3 would be equal to the voltage value (x) of the output voltage V4, and hence all possible offset voltages can be eliminated theoretically according to this disclosure.

Then, simulation analysis upon this invention and the prior technique is provided as follows. Given that the DC source to energize the power source end Vp, the first power source end Vp1 and the second power source end Vp2 is set to be 5V, offset voltages corresponding to various input voltages (V3 or V1) are listed in Table 1.

TABLE 1

| Input voltage (V) | Prior technique (mV) | This invention (mV) |
|---|---|---|
| 0.5 | −0.370377 | −0.000028 |
| 1 | −0.39552 | −0.000024 |
| 1.5 | −0.42081 | −0.000023 |
| 2 | −0.44606 | −0.000024 |
| 2.5 | −0.47177 | −0.000025 |
| 3 | −0.49879 | −0.000027 |
| 3.5 | −0.52933 | −0.000031 |
| 4 | −0.7002 | −0.000061 |

According to foregoing analysis, the offset voltages of the Prior technique are ranged between 0.3 mV and 0.7 mV, and, the more the input voltage is, the corresponding offset voltage would be. On the other hand, the offset voltages of this invention are ranged between 0.00002 mV and 0.00006 mV. From Table 1, it is obvious that, no matter what the input voltage is, the corresponding offset voltage of this invention is far less than that of the Prior technique. It implies that this invention can reduce the voltage offset effectively so as to have the output voltage V4 to be further close to the input voltage V3. In addition, since the output voltage is always less than the input voltage, thus the aforesaid values of the offset voltages are negative.

Then, given the input voltage (V1 or V3) to be 1V, the offset voltages corresponding to different DC sources to energize the power source end Vp, the first power source end Vp1 and the second power source end Vp2 are listed in Table 2.

TABLE 2

| DC source (V) | Prior technique (mV) | This invention (mV) |
|---|---|---|
| 2 | −0.69071 | −0.000095 |
| 2.5 | −0.47186 | −0.000044 |
| 3 | −0.41332 | −0.000032 |
| 3.5 | −0.39292 | −0.000025 |
| 4 | −0.38678 | −0.000024 |
| 4.5 | −0.38648 | −0.000023 |
| 5 | −0.39552 | −0.000024 |
| 5.5 | −0.46814 | −0.000028 |
| 6 | −0.46814 | −0.000035 |

According to foregoing analysis, the offset voltages of the Prior technique are ranged between 0.4 mV and 0.6 mV, and the offset voltages of this invention are ranged between 0.00002 mV and 0.00009 mV. With the same input voltage, it is obvious from Table 2 that different DC sources would affect the offset voltages. In addition, no matter what the voltage of the DC source is, the corresponding offset voltage of this invention is far less than that of the Prior technique. It implies that this invention can reduce the voltage offset effectively so as to have the output voltage V4 to be further close to the input voltage V3.

Then, given the input voltage (V1 or V3) to be 2.5V, the offset voltages corresponding to different DC sources to energize the power source end Vp, the first power source end Vp1 and the second power source end Vp2 with respect to different temperatures are listed in Table 3.

TABLE 3

| Temperature (° C.) | Prior technique (mV) | This invention (mV) |
|---|---|---|
| −40 | −0.37801 | −0.000009 |
| 0 | −0.43819 | −0.000022 |
| 40 | −0.49088 | −0.000027 |
| 80 | −0.54069 | −0.000033 |
| 120 | −0.59337 | −0.000039 |
| 160 | −0.71584 | −0.000051 |

According to foregoing analysis, the offset voltages of the Prior technique are ranged between 0.3 mV and 0.7 mV, and the offset voltages of this invention are ranged between 0.000009 mV and 0.00005 mV. With the same input voltage and DC source, it is obvious from Table 3 that different temperatures would affect the offset voltages, as well. In addition, the more the temperature is, the larger the offset voltage would be. Also, no matter what the temperature is, the corresponding offset voltage of this invention is far less than that of the Prior technique. It implies that this invention can reduce the voltage offset effectively so as to have the output voltage V4 to be further close to the input voltage V3.

Figure 3:
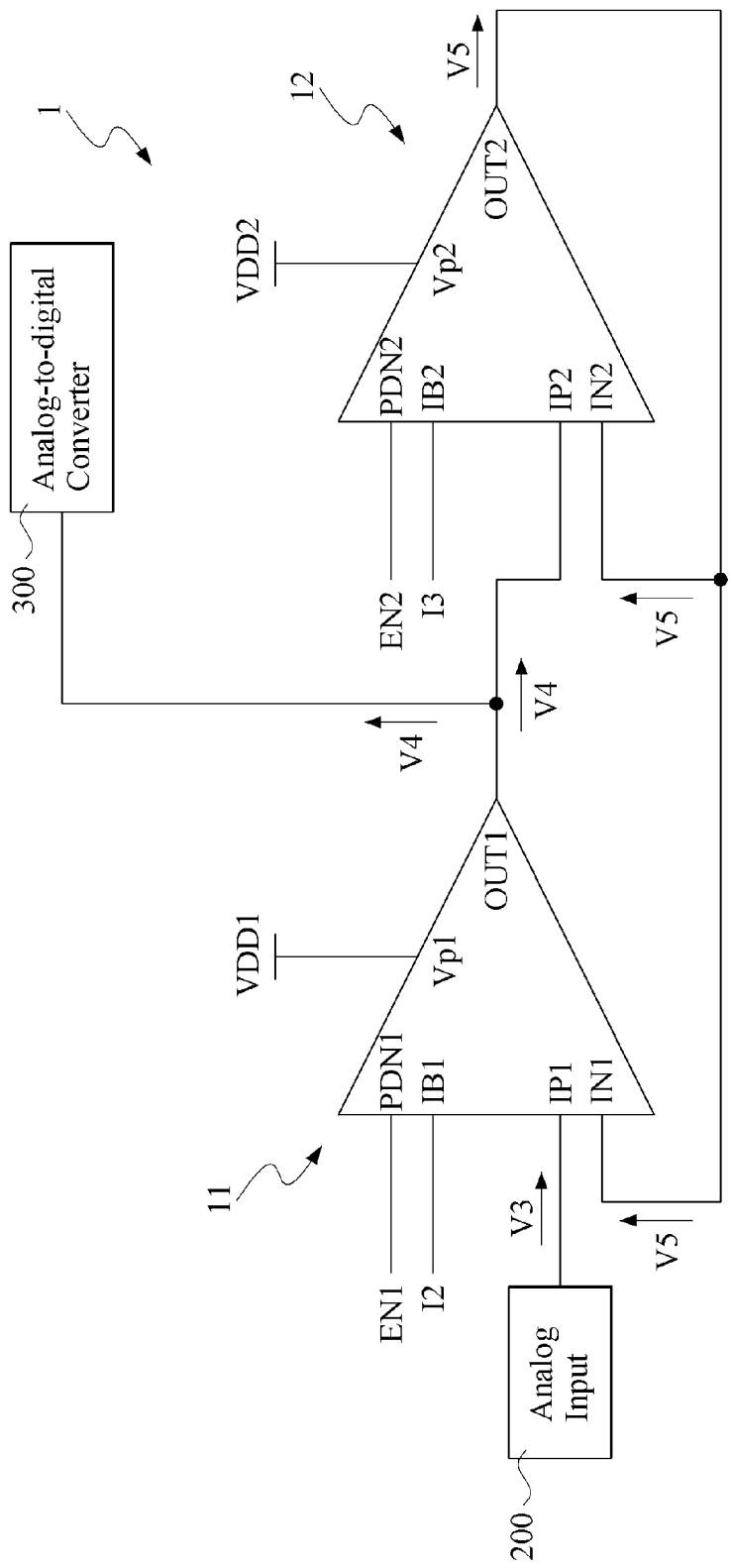
FIG. 3 is a schematic view of a first exemplary example of the present invention.
Figure 4:
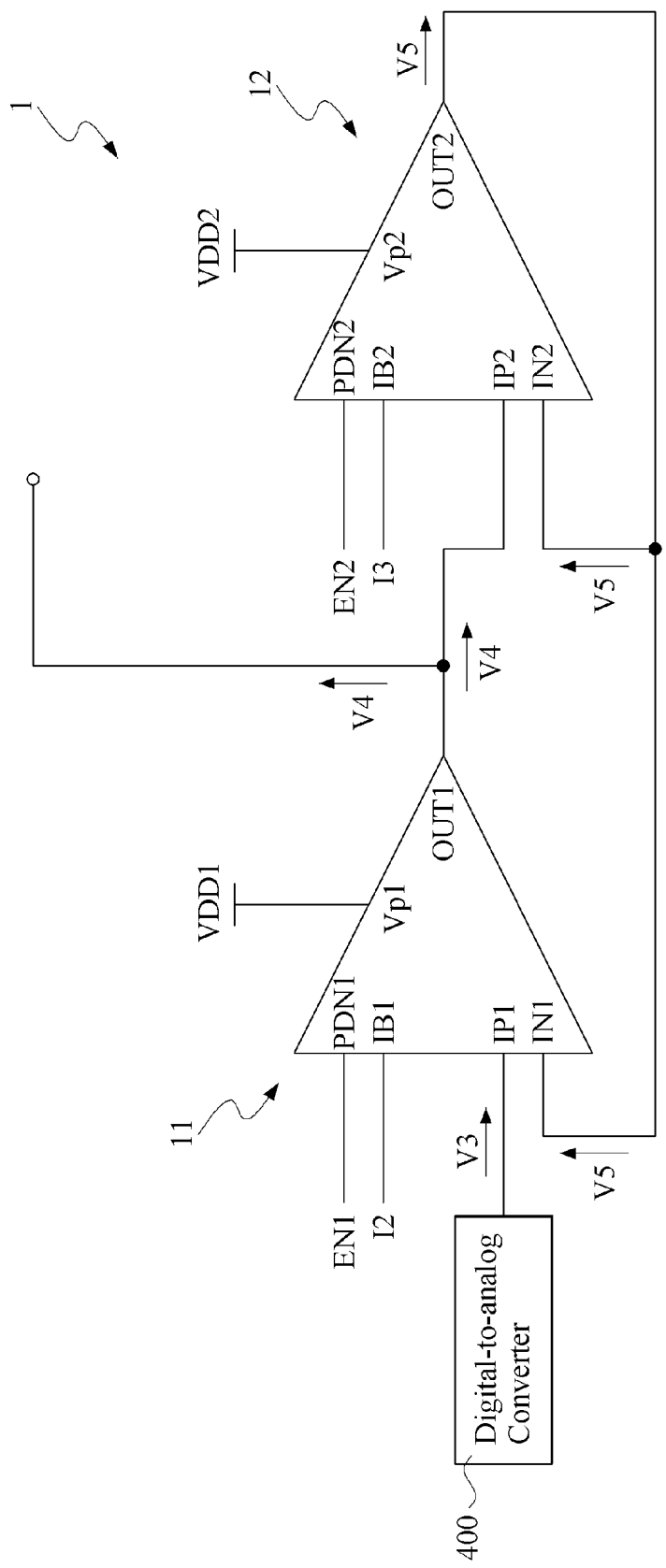
FIG. 4 is a schematic view of a second exemplary example of the present invention.
Figure 5:
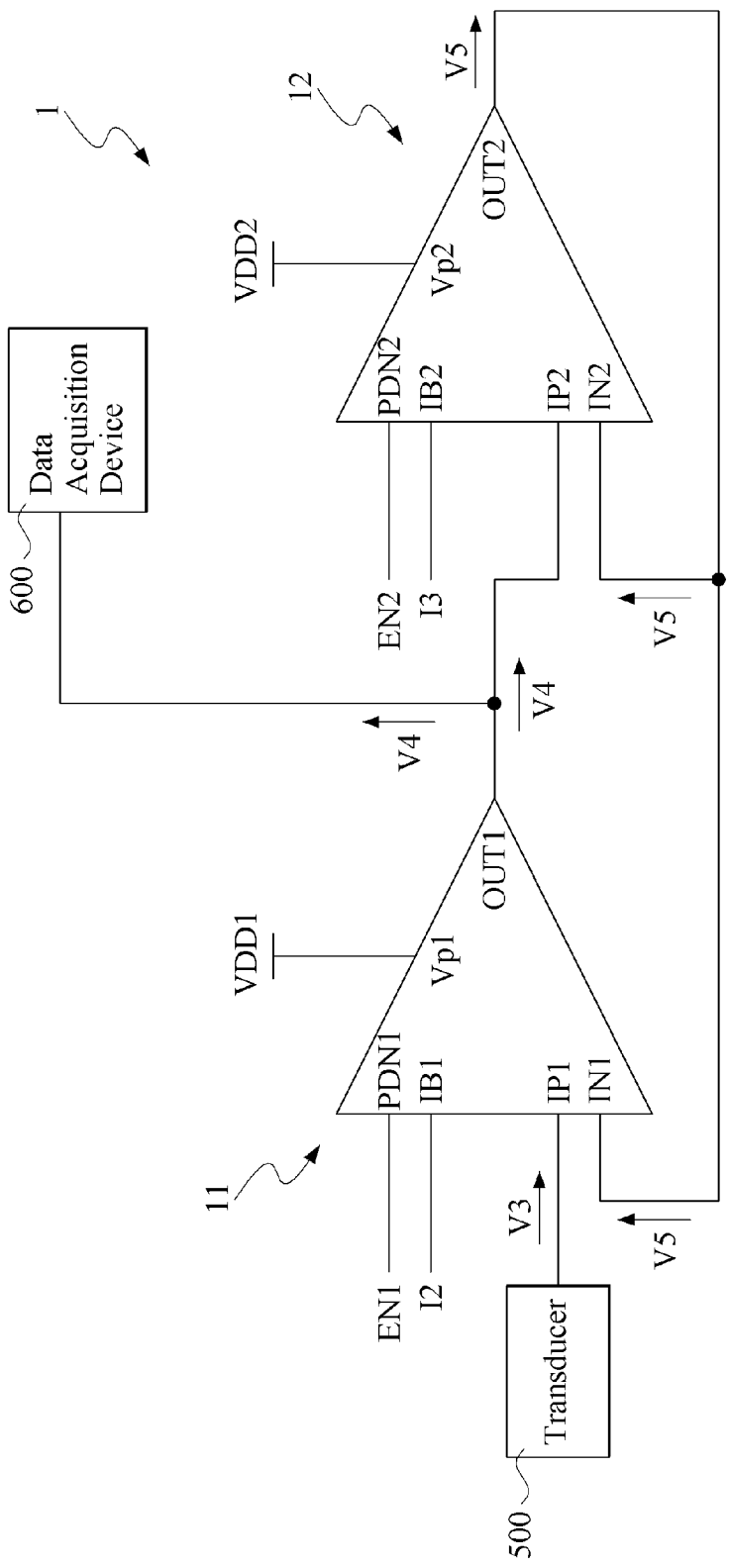
FIG. 5 is a schematic view of a third exemplary example of the present invention.

Finally, refer to FIG. 2 through FIG. 5 together; where FIG. 3 is a schematic view of a first exemplary example of the present invention, FIG. 4 is a schematic view of a second exemplary example of the present invention, and FIG. 5 is a schematic view of a third exemplary example of the present invention.

As shown in FIG. 3, the unity-gain buffer circuit structure 1 can be applied between an analog input 200 and an analog-to-digital converter 300. The first positive input IP1 of the first operational amplifier 11 is coupled with the analog input 200, while the first output OUT1 thereof is coupled with the analog-to-digital converter 300. In this exemplary example, the analog input 200 can send a signal to the analog-to-digital converter 300 for measurement, and thus the unity-gain buffer amplifier 1 is required to isolate the analog input 200 from the analog-to-digital converter 300. In this application, the unity-gain buffer circuit structure 1 of this invention is applied to serve as an isolation structure capable of reducing effectively the offset voltage.

As shown in FIG. 4, the unity-gain buffer circuit structure 1 can be applied to a digital-to-analog converter 400. In this application, the first positive input IP1 of the first operational amplifier 11 is coupled with the digital-to-analog converter 400. While the digital-to-analog converter 400 works, the unity-gain buffer circuit structure is utilized as a buffer device. Namely, the unity-gain buffer circuit structure 1 of this invention is applied to serve as a unity-gain buffer that can provides performance in buffering and also in reducing the offset voltage.

As shown in FIG. 5, the unity-gain buffer circuit structure 1 can be applied between a sensor 500 and a data acquisition device 600. The first positive input IP1 of the first operational amplifier 11 is coupled with the sensor 500, while the first output OUT1 thereof is coupled with the data acquisition device 600. In this exemplary example, during signal transmission of the sensor 500 and the data acquisition device 600, the signal is always decaying. Thus, the unity-gain buffer is required. However, the unity-gain buffer itself may produce a voltage offset. Thus, while in reducing the offset voltage effectively, the unity-gain buffer circuit structure 1 of this invention can also promote the data transmission, such that possible rapid signal decaying caused by the offset voltage thereof can be substantially lessened.

In FIG. 3 to FIG. 5, three simple exemplary examples of the unity-gain buffer circuit structure 1 are demonstrated, but applications of this invention are not limited thereto. Whenever a unity-gain buffer is needed, the unity-gain buffer circuit structure 1 of this invention can be applied.

In summary, in the unity-gain buffer circuit structure provided by this invention, the first operational amplifier and the second operational amplifier are coupled together to reduce the offset voltage. In comparison with the conventional design, both the theoretical derivation and the simulation data have proven that this invention can effectively reduce the offset voltage so as to drive the offset voltage close to 0, such that the output voltage can be substantially equal to the input voltage.

While the present invention has been particularly shown and described with reference to a preferred embodiment, it will be understood by those skilled in the art that various changes in form and detail may be without departing from the spirit and scope of the present invention.

What is claimed is:

1. A unity-gain buffer circuit structure, configured to receive an input voltage and output an output voltage, comprising:
   a first operational amplifier, including:
      a first positive input, used to receive the input voltage;
      a first output, used to output the output voltage;
      a first negative input; and
      a first switch end, wherein the first operational amplifier is activated upon when the first switch end receives a first starting voltage; and a second operational amplifier, coupled electrically with the first operational amplifier, including:
   a second positive input, used to receive the output voltage;
   a second output, coupled with the first negative input, used to output a second output voltage; and
   a second negative input, coupled with the second output, used to receive the second output voltage;
wherein, after the first negative input receives the second output voltage, an offset voltage between the output voltage outputted from the first operational amplifier and the input voltage received by the first operational amplifier is close to 0.

2. The unity-gain buffer circuit structure of claim 1, wherein the second operational amplifier further includes a second switch end, and the second operational amplifier is activated upon when the second switch end receives a second starting voltage.

3. The unity-gain buffer circuit structure of claim 1, wherein the first operational amplifier further includes a first power source end for receiving a first DC source.

4. The unity-gain buffer circuit structure of claim 3, wherein the second operational amplifier further includes a second power source end for receiving a second DC source identical to the first DC source.

5. The unity-gain buffer circuit structure of claim 1, wherein the first operational amplifier further includes a first bias current end for receiving a first bias current.

6. The unity-gain buffer circuit structure of claim 5, wherein the second operational amplifier further includes a second bias current end for receiving a second bias current identical to the first bias current.

\* \* \* \* \*